United States Patent [19]
Allen et al.

[11] Patent Number: 5,793,266
[45] Date of Patent: Aug. 11, 1998

[54] DIFFERENTIAL INPUT AND/OR DIFFERENTIAL OUTPUT, TRANSVERSELY-COUPLED SURFACE ACOUSTIC WAVE FILTER

[75] Inventors: Donald Eugene Allen, Gilbert; Jeffrey Thomas Mink, Tempe, both of Ariz.

[73] Assignee: Motorola Inc., Schaumburg, Ill.

[21] Appl. No.: 689,451

[22] Filed: Aug. 12, 1996

[51] Int. Cl.$^6$ .................................................. H03H 9/64
[52] U.S. Cl. ...................... 333/193; 333/195; 310/313 B; 310/313 D
[58] Field of Search ................................ 333/193–196; 310/313 R, 313 B, 313 C, 313 D

[56] References Cited

U.S. PATENT DOCUMENTS

| | | | |
|---|---|---|---|
| 4,542,356 | 9/1985 | Nakazawa et al. | 333/195 |
| 5,265,267 | 11/1993 | Martin et al. | 455/326 |
| 5,365,138 | 11/1994 | Saw et al. | 310/313 D |

FOREIGN PATENT DOCUMENTS

| | | | |
|---|---|---|---|
| 0648015 | 10/1994 | European Pat. Off. | |
| 0698965 | 8/1995 | European Pat. Off. | |
| 5-129884 A | 5/1993 | Japan | 333/193 |
| 9111856 | 1/1991 | WIPO | |
| 9116763 | 4/1991 | WIPO | |
| 9308641 | 3/1993 | WIPO | |

OTHER PUBLICATIONS

An article entitled "Narrow Bandpass Filter Using Double-Molde Saw Resonators On Quartz", by M. Tanaka, T. Morita, K. Ono and Y. Nakazawa, from 1984 IEEE.

An article entitled "A COM Analysis of SAW Waveguid-Coupled Resonator Filters", by Y. Xu and P.M. Smith, in 1993 IEEE.

An article entitled "Coupled Resonator Filters With Differential Input and/or Differential Output", by M.A. Sharif, M.A. Schwab, D.P. Chen and C.S. Hartmann in 1995 IEEE.

*Primary Examiner*—Benny Lee
*Assistant Examiner*—Barbara Summons
*Attorney, Agent, or Firm*—Brian M. Mancini; Gary J. Cunningham

[57] ABSTRACT

A method for making an acoustic wave device (500, 600, 701, 801, 901, 1001), and an acoustic wave device (500, 600, 701, 801, 901, 1001) made by the method. The method comprises steps of providing a substrate (11) capable of supporting acoustic wave propagation and disposing a first transducer (518, 518') thereon. Disposing the first transducer (518, 518') includes disposing first through fourth electrode groups on the substrate. The first group couples to a first electrical interconnection (17+). The second group couples to a second electrical interconnection (17–). The third group couples to a common electrical interconnection and is interleaved with the first group of electrodes. The fourth group couples to the common electrical interconnection and is interleaved with the second group. The fourth group is disposed in an in-line configuration with the third group and is offset therefrom by an integral number of half-wavelengths of an acoustic wave corresponding to a center frequency of the acoustic wave device.

12 Claims, 9 Drawing Sheets

DIFFERENTIAL INPUT AND/OR DIFFERENTIAL OUTPUT, TRANSVERSELY-COUPLED SURFACE ACOUSTIC WAVE FILTER

FIELD OF THE INVENTION

This invention pertains to microelectronic devices employing acoustic waves and more particularly to differential input, differential output, transversely-coupled surface acoustic wave (SAW) filters.

BACKGROUND OF THE INVENTION

Figure 1:
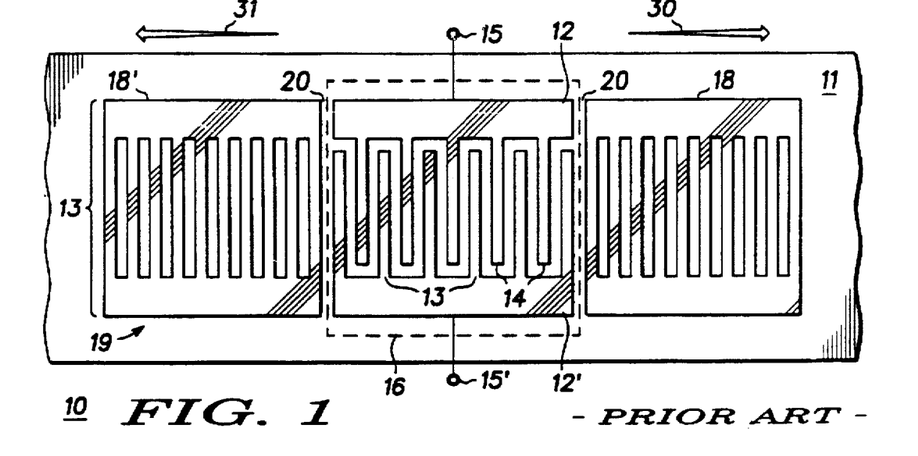
FIG. 1 illustrates the electrode configuration of a single pole surface acoustic wave (SAW) resonator in accordance with the prior art.

As used herein, the terms "electrode fingers", "electrodes" and "fingers" are used interchangeably to mean electrodes extending across an acoustic path, with a long dimension generally parallel to acoustic wavefronts of acoustic waves within that path. FIG. 1 illustrates the configuration of electrodes 14 of single pole SAW resonator 10 in accordance with the prior art. FIG. 1 illustrates acoustic wave propagating substrate 11 having pattern 19 disposed thereon. SAW resonator 10 has single-ended input terminal 15 referenced to ground terminal 15'. Pattern 19 usefully comprises bus bars 12, 12' connected to a series of electrode fingers 14. Electrode fingers 14 and bus bars 12, 12' together form transducer 16. Transducer 16 is disposed along a preferred axis of the substrate material and on a suitably prepared surface thereof. Transducer 16 comprises a series of periodically disposed electrode fingers 14, often one-fourth of an acoustic wavelength in width, disposed on one-half acoustic wavelength centers, usually alternately coupled to associated bus bars 12, 12', although other arrangements are possible and useful. Electrical stimulation applied to terminal 15 (i.e., across bus bars 12, 12') at an appropriate frequency causes acoustic energy to propagate in first track 13. Transducers such as transducer 16 typically launch acoustic waves in directions 30, 31 when excited by electrical signals of appropriate frequency at bus bars such as 12, 12' and typically manifest electrical signals at the bus bars when insonified by acoustic waves of appropriate frequency traveling along directions 30 and/or 31.

Resonators of this type typically include at least two reflectors 18, 18' and at least one transducer 16 disposed between reflectors 18, 18', collectively forming first track 13. Another important design feature in FIG. 1 are gaps 20 disposed between reflectors 18, 18' and transducer 16. Gaps 20 typically have a width exceeding one-fourth of the acoustic wavelength.

Figure 2:
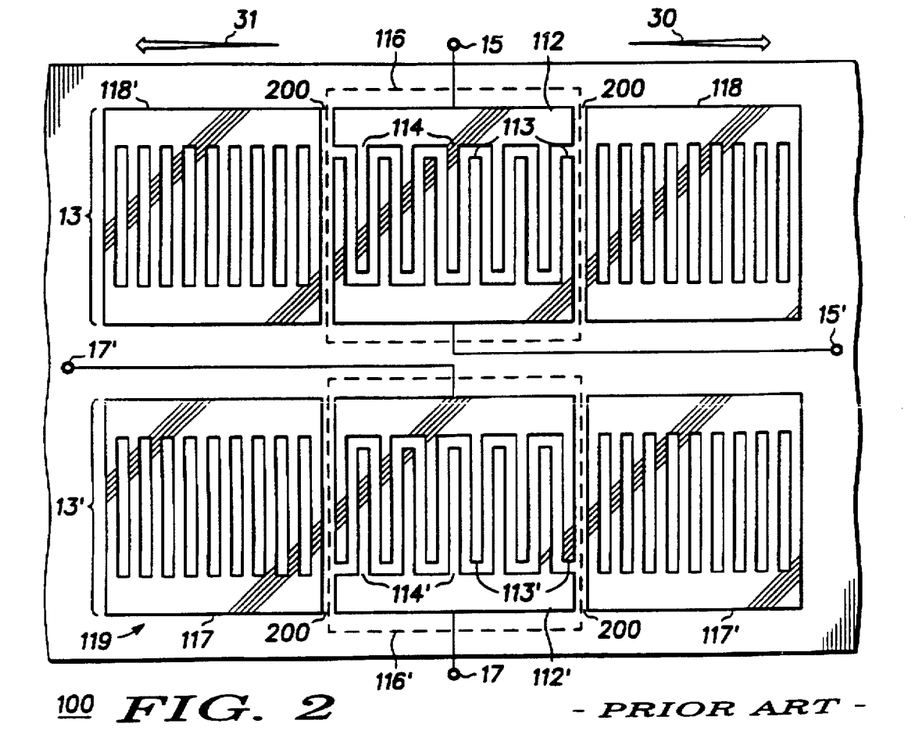
FIG. 2 illustrates how a transversely-coupled two-pole SAW resonator is formed in accordance with the prior art.

FIG. 2 illustrates a plan view of transversely-coupled resonator 100, formed by placing two single-pole SAW resonators in close proximity in accordance with the prior art. Acoustic wave propagating substrate 11 has pattern 119 disposed thereon. Transversely-coupled SAW resonator 100 includes input terminal 15, grounded terminal 15', output terminal 17 and grounded terminal 17'. Pattern 119 usefully comprises bus bars 112, 112' connected to a series of electrode fingers 114, 114', respectively. Electrode fingers 114, input bus bar 112 and grounded electrode fingers 113 form transducer 116. Similarly, electrode fingers 114', output bus bar 112' and grounded electrode fingers 113' form transducer 116'. Transducers 116, 116' are disposed along a preferred axis of the substrate material and on a suitably prepared surface thereof. Resonators of this type typically include at least two reflectors 118, 118' and at least one transducer 116 or 116' disposed between reflectors 118, 118' or 117, 117', respectively. Another important design feature in FIG. 2 are gaps 200 disposed between reflectors 118, 118' or 117, 117' and transducer(s) 116, 116'. Gaps 200 typically have a width exceeding one-fourth of an acoustic wavelength.

Transducer 116 and reflector gratings 118, 118' together form first track 13 and transducer 116' and reflector gratings 117, 117' together form second track 13' of transversely-coupled SAW resonator 100. Electrical stimulation impressed on terminal 15 at an appropriate frequency causes acoustic energy in first track 13. This energy is transversely coupled to second track 13' and is finally converted to electrical energy at terminal 17.

Figure 3:
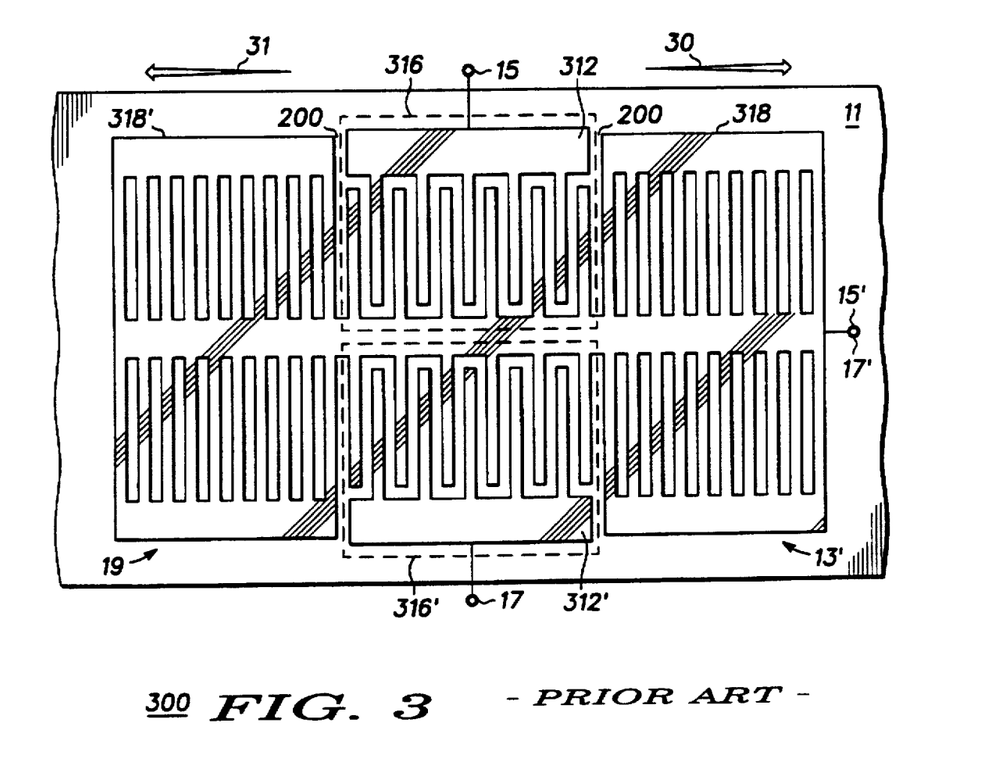
FIG. 3 illustrates a simplified plan view of another embodiment of a transversely-coupled two-pole SAW filter having a single input and a single output terminal in accordance with the prior art.

FIG. 3 illustrates another embodiment of prior art two-pole transversely-coupled SAW filter 300. In this embodiment, terminal 15 couples electrical signals into bus bar 312 and these are converted to acoustic energy via transducer 316. This acoustic energy in first track 13 couples to second track 13' and is in turn converted to electrical energy via transducer 316', which is electrically coupled to bus bar 312' and terminal 17. It is known in the art to ground both 15' and 17' at a common ground location. The frequency dependence of the efficiency of conversion of electrical energy to acoustic energy is determined primarily by the configuration of transducers 316, 316' and reflectors 318, 318' and this frequency dependence gives rise to a transfer function having useful filtering properties.

Figure 4:
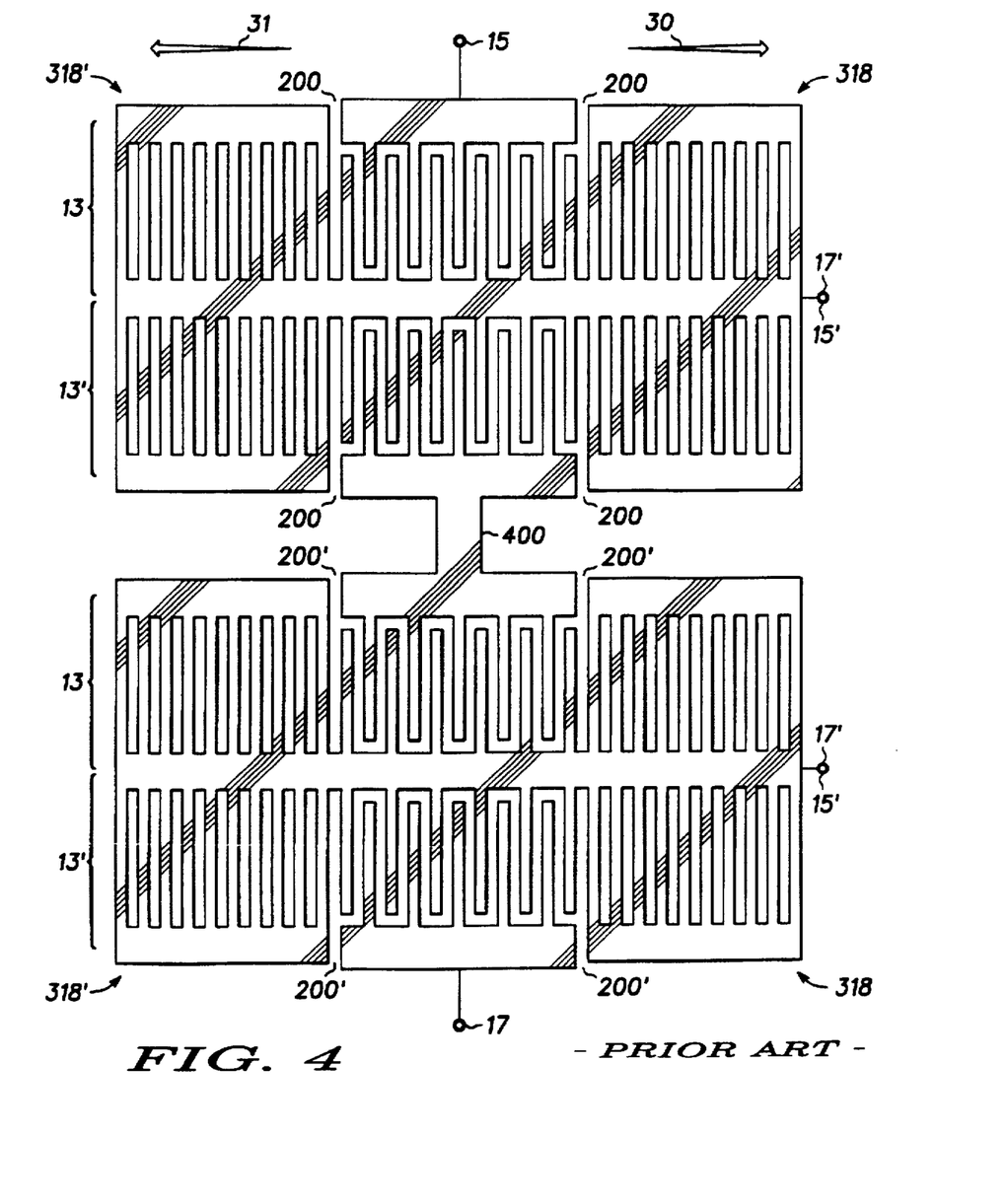
FIG. 4 illustrates a simplified plan view of a transverse-coupled four-pole SAW filter having a single input terminal and a single output terminal in accordance with the part.

FIG. 4 illustrates a simplified plan view of a transversely-coupled four-pole SAW filter having a single input terminal and a single output terminal in accordance with the prior art. Prior art four-pole transversely-coupled SAW filters are manufactured by joining together pairs of prior art two-pole transversely-coupled SAW filters with a single electrical coupling trace 400.

Substrates 11 of ST-cut quartz (cut angle=42.75°) having cut angles in the range of 32°–42+° are preferred for some applications. Filter patterns are typically fabricated by depositing and patterning a thin metal film, often comprising aluminum in a thickness ranging from a few tens to a few hundreds of nanometers thick, by techniques similar to those employed in integrated circuit manufacturing. Basic single-pole SAW resonator 10 (FIG. 1) typically contains transducer 16 including interdigitated electrode fingers 14 disposed between reflective gratings 18, 18'. When two single pole SAW resonators are placed in close proximity to one another, a new mode structure is created and energy is coupled in a transverse direction, from a first transducer and reflective grating track to a second transducer and reflective grating track. For example, when first track 13 is driven electrically, energy will couple to second track 13' and transversely-coupled filter 300 (FIG. 3) results.

Transversely-coupled resonator filters 100, 300 (FIGS. 2 and 3, respectively) offer narrow-band filtering of signals present at input terminals 15, 15' to provide output signals at output terminals 17, 17'. This type of transversely-coupled resonator filter offers single layer fabrication, steep skirted filtering with superior close-in rejection. For this reason, transversely-coupled SAW filters are frequently being used as narrow-bandwidth intermediate frequency filters suitable for use in current cellular telephone design configurations.

Unfortunately, the transversely coupled resonator filter geometry does not readily lend itself to operate in a balanced (differential) input and/or balanced (differential) output configuration. However, the balanced configuration is oftentimes highly desirable from a design perspective. A balanced configuration is understood to mean equal impedances between the positive lead and ground and the negative lead and ground. Nevertheless, there are increasing demands from designers in the telecommunications industry for Surface Acoustic Wave (SAW) filters able to operate with differential input and/or output terminations.

If a SAW filter could be designed with differential input, and/or differential output, terminal configurations, this SAW filter could then be placed directly in line with other electronic components such as a balanced or double balanced mixer or a balanced amplifier, for example, in a cellular telephone. Such SAW filter designs eliminate need for other components such as transformers or baluns, reducing the overall number of components in the final product and results in other benefits such as lighter weight, reduced size and less power consumption. What is needed is a Surface Acoustic Wave (SAW) filter design incorporating unique transducer layouts to provide differential input and/or differential output transversely-coupled resonators and associated methods for providing same.

DETAILED DESCRIPTION OF THE DRAWINGS

Figure 5:
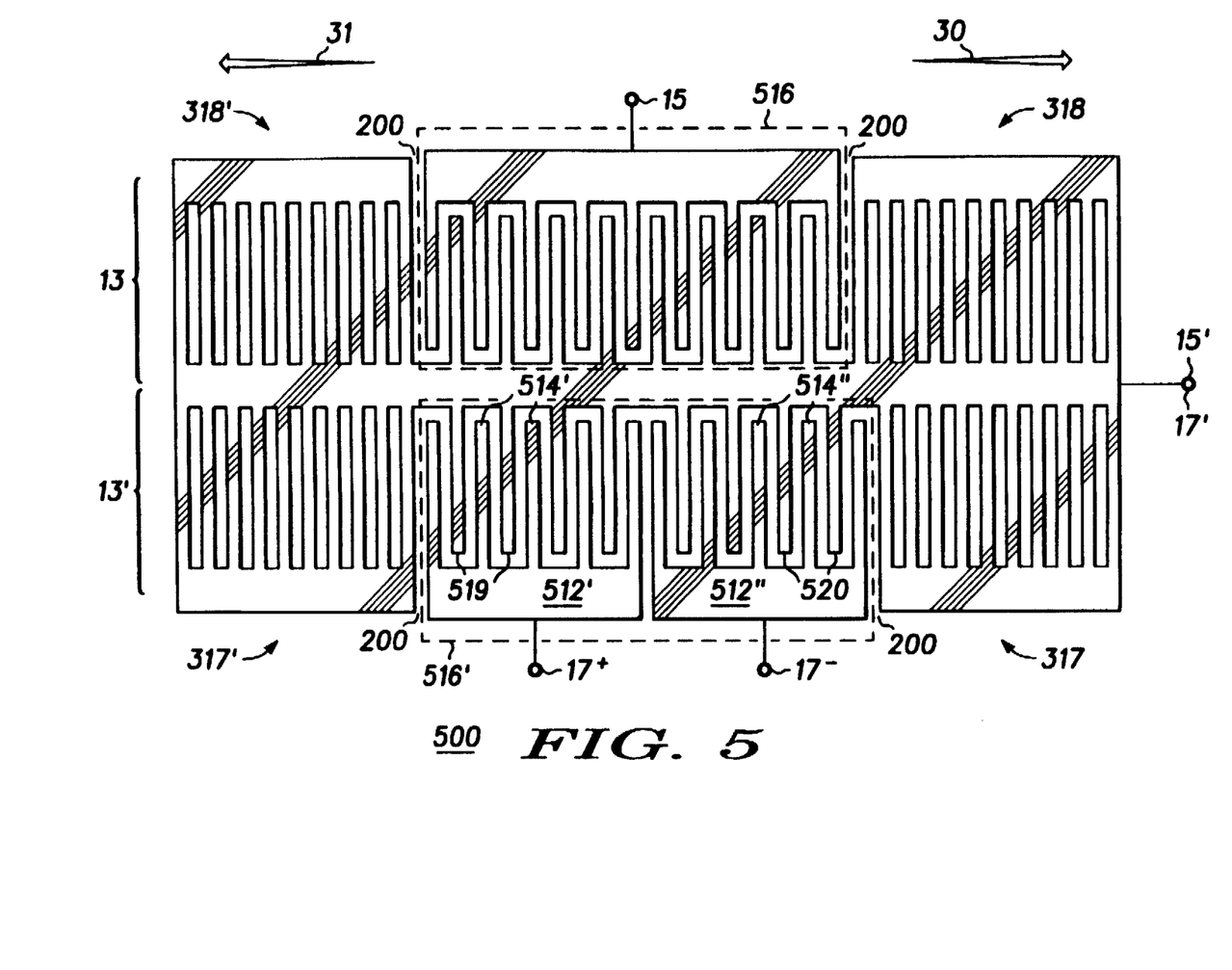
FIG. 5 illustrates a first embodiment of the present invention applied to a two-pole transversely-coupled filter in which the resonators have one input terminal and differential output terminals with a common ground terminal in accordance with the instant invention.

Applicants have discovered an approach to SAW transducer design allowing balanced feed signals to be directly coupled to a SAW filter without requiring use of baluns, transformers and the like. FIG. 5 illustrates one application of differential SAW transducer 516' in a coupled resonator filter but it will be apparent to those of skill in the relevant arts that such transducers may be employed in other types of SAW devices and that single transducers not acoustically coupled to other transducers find utility as frequency-dependent impedances in such applications as frequency-selection components and notch filters.

FIGS. 5–10 illustrate novel designs in accordance with the present invention employing differential input and/or output, transversely-coupled SAW resonators.

EXAMPLE I

FIG. 5 illustrates a first embodiment of the present invention applied to two-pole transversely-coupled filter 500 having single-ended input terminal 15 and differential output terminals 17+, 17− with a common ground terminal. This design can be incorporated into the design of electronic equipment such as a portable cellular telephone in such a manner as to lower the total number of components, reducing both weight and size. Of course, this invention is not limited to cellular telephone designs but could also be in incorporated into any piece of electronic equipment which uses SAW filters.

First track 13 comprises single-ended input transducer 516 having terminal 15 and reflectors 318, 318' whereas second track 13' comprises differential transducer 516' having terminations 17+, 17−, ground and reflectors 317, 317'. This requires that the output bus bar be partitioned into two separate and distinct components 512', 512", and the corresponding electrode fingers also are segregated into separate and distinct groups 514', 514". Groups 514', 514" are spatially separated in phase by an extra half of an acoustic wavelength and ground electrodes 519, 520 are also offset by an extra half of an acoustic wavelength.

In other words, electrodes 514', 519 form a first set of comb electrodes having electrodes 519 coupled to a common or ground node offset by half of an acoustic wavelength (or any integral multiple thereof) from electrodes 520 also coupled to the common or ground electrode, where electrodes 520 are included in a second set of comb electrodes comprising electrodes 514", 520. Filter 500 converts signals from unbalanced to a balanced conditions (or vice versa) for a variety of electronic design applications while simultaneously providing a filtering function. "Coupled Resonator Filters With Differential Input And/Or Differential Output" by M. A. Sharif et al., pp. 67–70 of the 1995 Ultrasonics Symposium Proceedings, IEEE Cat. No. 0-7803-2940-6/95, describes impedances present at terminals 17+, 17− and these are basically four times what would obtain for a single-ended transducer of otherwise comparable geometry (see, e.g., Eq. 6 and associated text).

EXAMPLE II

Figure 6:
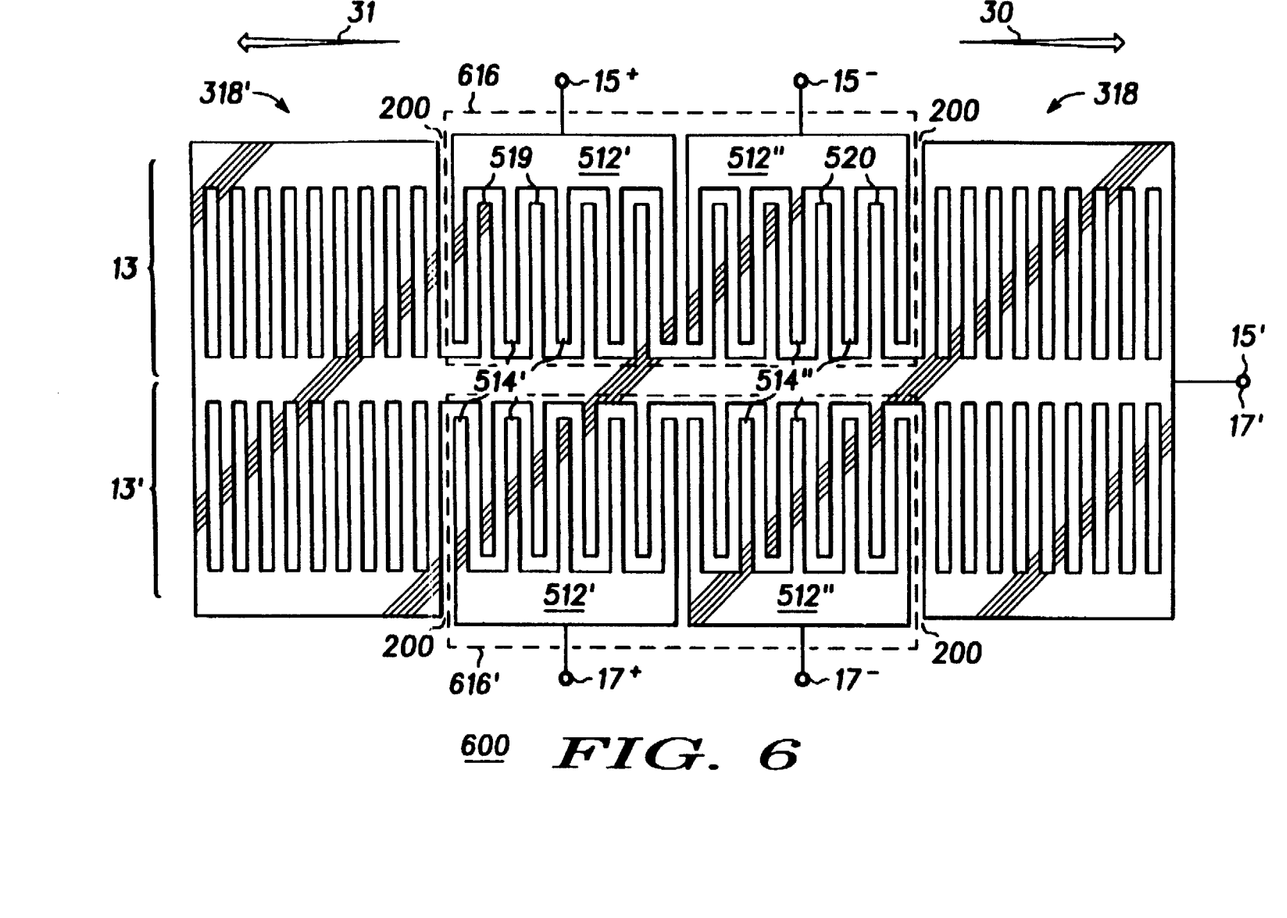
FIG. 6 illustrates a second embodiment of the present invention applied to a two-pole transversely-coupled filter in which the resonators have differential input terminals and differential output terminals with a common ground terminal.

FIG. 6 illustrates a second embodiment of the present invention applied to a two-pole transversely-coupled filter in which tracks 13, 13' have differential input terminals 15+, 15− and differential output terminals 17+, 17− with a common ground terminal. In this embodiment, transducers 616, 616' were designed to provide differential input and differential output.

Filter 600 has input terminals 15+, 15− and output terminals 17+, 17−, providing balanced input, balanced output, two-pole transversely-coupled SAW filter 600. In first track 13, input terminal 15+ couples to first set of electrodes 514' while input terminal 15− couples, via bus bar 512" to second set of electrodes 514" separated from first group of electrodes 514' by a multiple of acoustic half wavelengths and ground electrodes 519, 520 are also offset by an extra half of an acoustic wavelength. Reflectors 318, 318' bound both first and second tracks 13, 13'.

Second track 13' includes output terminal 17+ coupled to first group of electrodes 514' via bus bar 512' and output terminal 17− coupled to second group of electrodes 514" separated from first group of electrodes 514' by a multiple of acoustic half wavelengths and ground electrodes 519, 520 are also offset by an extra half of an acoustic wavelength.

First and second tracks 13, 13' are each typically only a few acoustic wavelengths broad (vertical axis, FIG. 6) and accordingly support acoustic propagation modes having significant energy content outside of first and second tracks 13, 13'. For example, in one design, a seven wavelength breadth or aperture was employed together with a separation between tracks of 0.9 wavelength, for a center to center separation of 7.9 wavelengths. When cavity structures such as first and second tracks 13, 13' are coupled, new acoustic propagation modes are formed having properties calculable from knowledge of the coupling and of the modes of the original (uncoupled) structures. First and second tracks 13, 13' are usefully in a range of from four to thirteen wavelengths broad, desirably in a range of from seven to ten wavelengths broad and preferably are about eight to nine wavelengths broad, depending on design bandwidth.

In operation, electrical stimulation having appropriate frequency and phase applied to input terminals 15+, 15− results in acoustic energy being manifested in first track 13. Reflectors 318, 318' form a resonant cavity much like a Fabry-Perot cavity and this serves to trap acoustic energy in first track 13 along the horizontal axis. This energy is partially coupled into second track 13' by the close physical proximity of the two tracks, typically one-half to three wavelengths, and the fact that the acoustic modes of the two tracks overlap spatially to provide new acoustic modes for the combined structure. Acoustic energy in second track 13' gives rise to electrical energy being manifested at terminals 17+, 17−. The transfer functions of transducers 616, 616', first and second tracks 13, 13' and of the acoustic coupling combine to provide the overall frequency response of filter 600.

If desired or required, the ground connection between the two halves of filter 600 may be broken at the center of filter 600 (i.e., vertically through the central electrode running along the common border of tracks 13, 13'). Similarly, if desired, input ground may be isolated from output ground by omitting a central stripe of metallization in the electrode running along the common border between tracks 13, 13' (horizontally in FIG. 6). This configuration finds application for designs where it is desirable to isolate input and output grounds, for reducing crosstalk via ground or ground loops.

Figure 7:
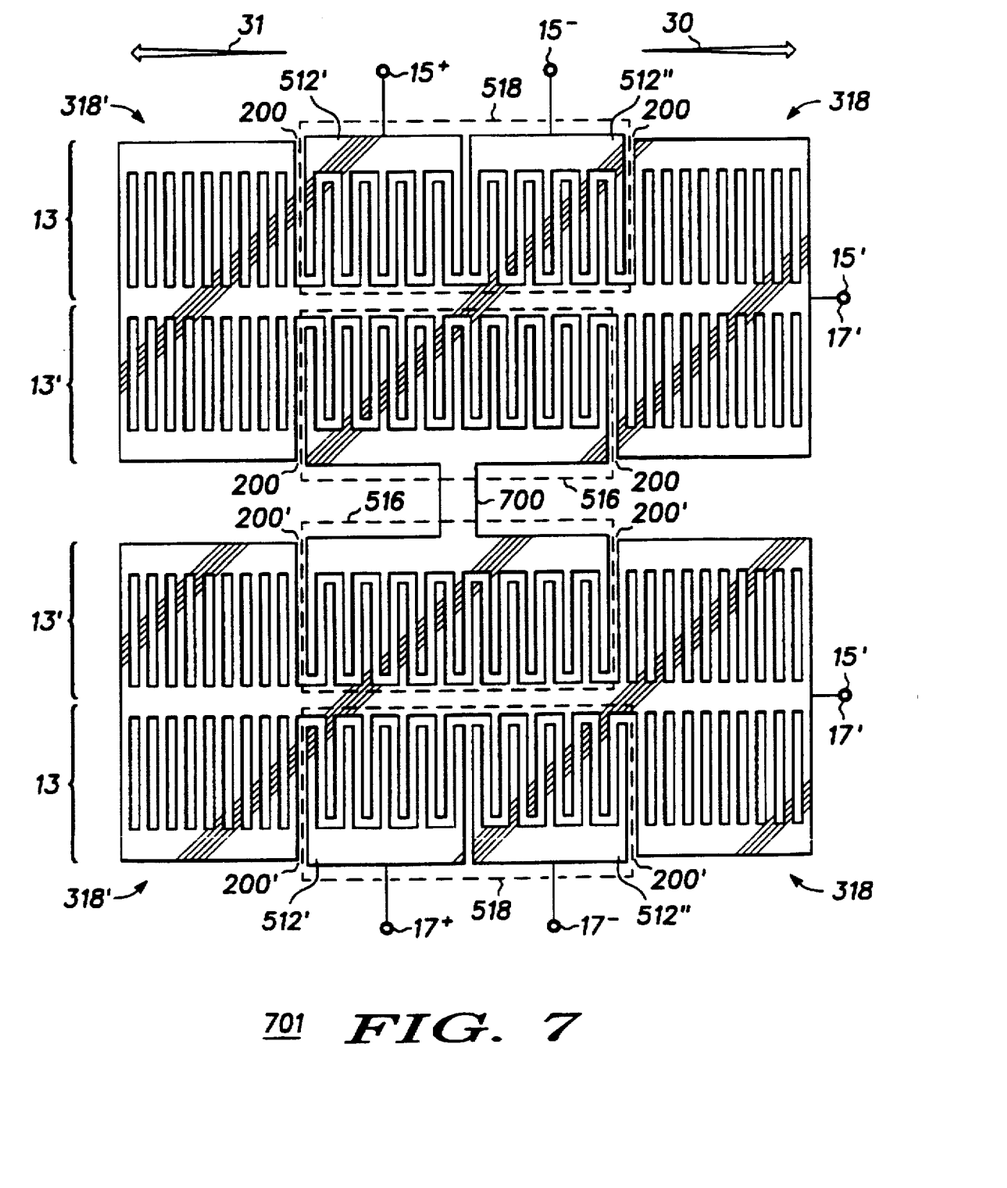
FIG. 7 illustrates a third embodiment of the present invention in which a four-pole transversely-coupled SAW filter is formed having a single coupling track between the resonator pairs.
Figure 8:
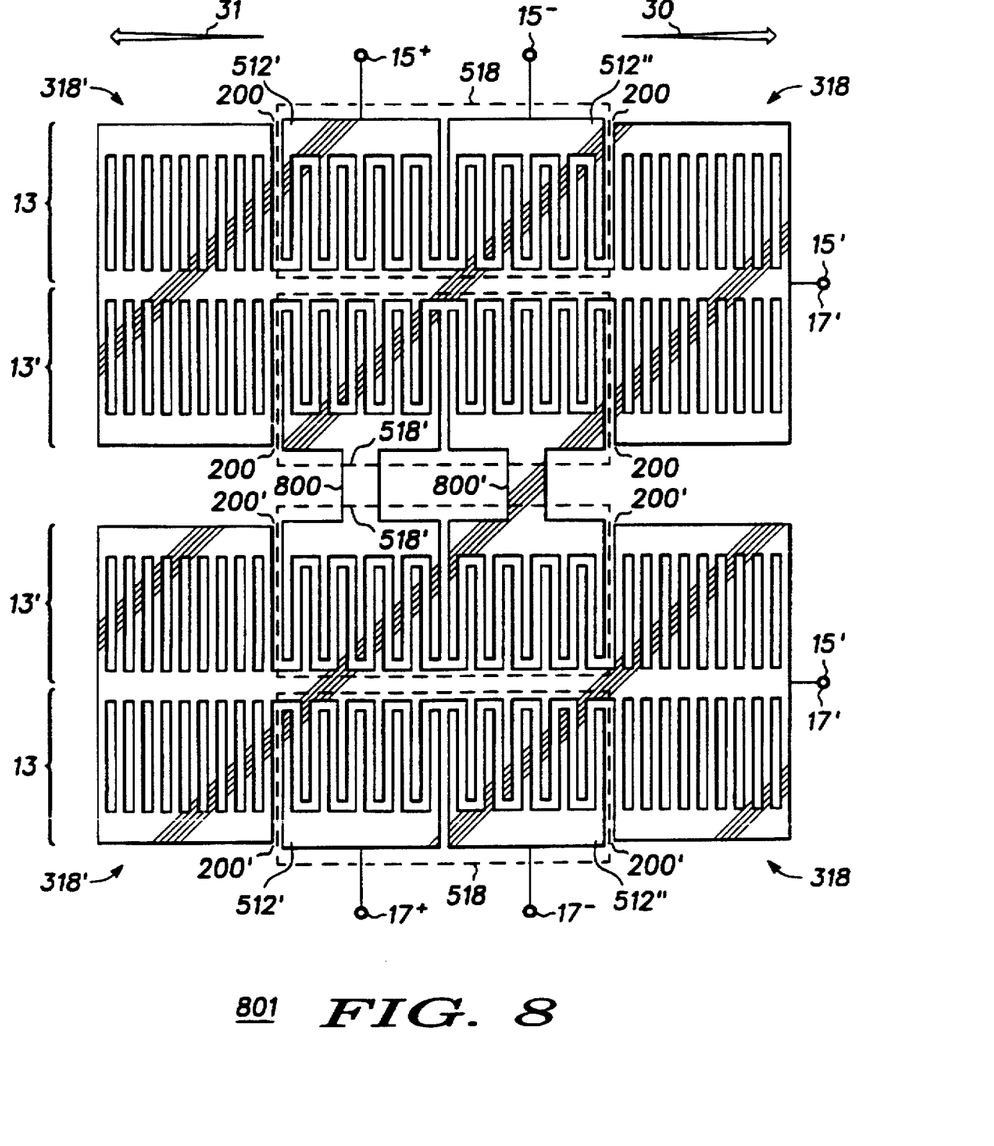
FIG. 8 illustrates a fourth embodiment of the present invention in which a four-pole transversely-coupled SAW filter is formed having a dual coupling track between the resonator pairs.

The new design according to the present invention may also be applied to four-pole transversely-coupled filters. Typically, by adding two more resonators to the two-pole transversely-coupled SAW filter design, an electrical frequency response with an improved profile having large out-of-band rejection can be achieved. FIGS. 7, 8 provide some examples showing how the novel termination design according to the present invention may be applied to four-pole SAW filter designs.

EXAMPLE III

FIG. 7 illustrates a third embodiment of the present invention in which four pole filter 701 combines a pair of structures like that of filter 500 (FIG. 5) via interconnection 700 to provide improved performance (e.g., increased out-of-band rejection, steeper skirts etc.) than is achieved by filter 500. While grounds between first and second tracks 13, 13' need not be common (i.e., the tracks may employ different grounds), an interconnection (not illustrated but implied by common grounds 15', 17') analogous to interconnection 700 may be provided between second tracks 13', 13' for improved operation, although this ground connection may be external to filter 701. Having a common ground, as illustrated, has the overall effect of minimizing the normally required tuning inductor(s) to a single inductor coupled between terminal 700 and ground. In the event of sufficiently long transducers 516, no inductor is required at terminal 700.

EXAMPLE IV

FIG. 8 illustrates a fourth embodiment of the present invention in which four-pole transversely-coupled SAW filter 801 is formed having a dual coupling track between the resonator pairs. This design is similar to filter 701 (FIG. 7) in that it has differential input terminals 15+, 15− and differential output terminals 17+, 17−, however, the actual transducer designs differ. Filter 801, having dual electrical coupling tracks 800, 800', also employs correspondingly different transducers 518, 518' in second and third tracks 13' of filter 801. Although filter 801 is a viable embodiment, it typically is a less desirable embodiment than is filter 701, because of the greater impedance at the 800, 800' interconnection. When this is consistent with the design requirements, this configuration may be preferred.

EXAMPLE V

Figure 9:
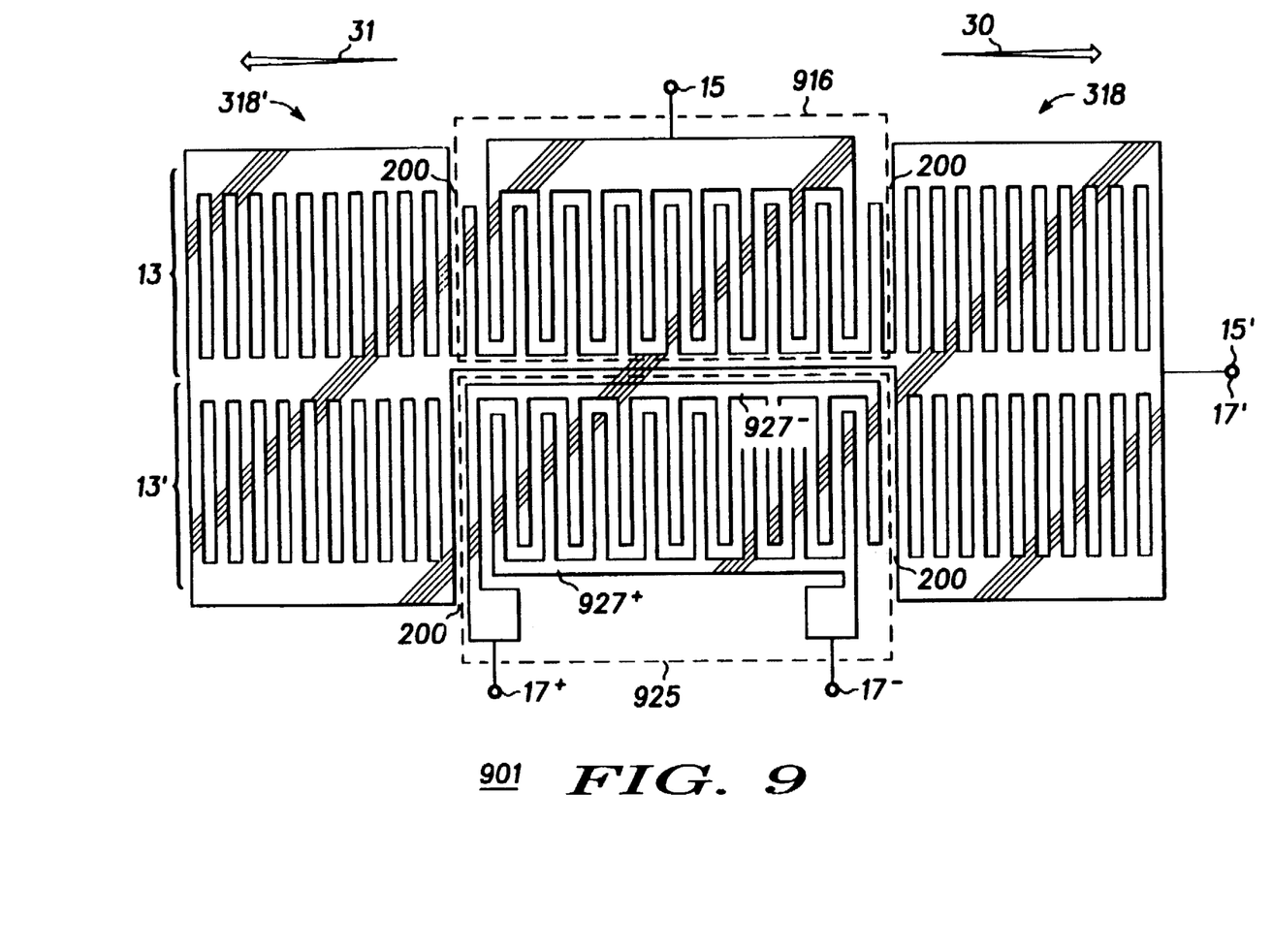
FIG. 9 illustrates a fifth embodiment of the present invention applied to a two-pole transversely-coupled filter in which the resonators have one input terminal and differential output terminals with a common ground terminal.

FIG. 9 illustrates a fifth embodiment of the present invention applied to a two-pole transversely-coupled filter in which transducer 916 has single-ended input terminal 15 and transducer 925 has differential output terminals 17+, 17− with a common ground terminal. Electrically, filter 901 is similar to filter 500 (FIG. 5). However, filter 901 illustrates still another way of designing output transducer 925. Although input transducer 916 is similar to input transducer 516 (FIG. 5), in this embodiment, bus bar 927− in output transducer 925 is drastically reduced in size and the electrode finger configuration is also redesigned. Applicants have discovered that this geometry provides advantages in insertion loss compared to filter 500 (FIG. 5) and also requires increased photolithographic resolution in bus bar 927−. In one set of designs that were experimentally evaluated, bus bar 927− had a dimension in direction perpendicular to directions 30/31 of about one micrometer and was separated from adjacent features by distances on the order of one micrometer or less, while bus bar 927+ had a dimension of about 100 micrometers measured along a direction perpendicular to directions 30/31. This two pole version employing transducer 925 provided an insertion loss of about 1.3 dB. An additional advantage of this transducer configuration is a reduction in impedance, especially for longer (i.e., in directions 30/31) transducers 925, compared to, e.g., transducers 200 (FIG. 6) because the impedance increase associated with the latter transducers is obviated.

EXAMPLE VI

Figure 10:
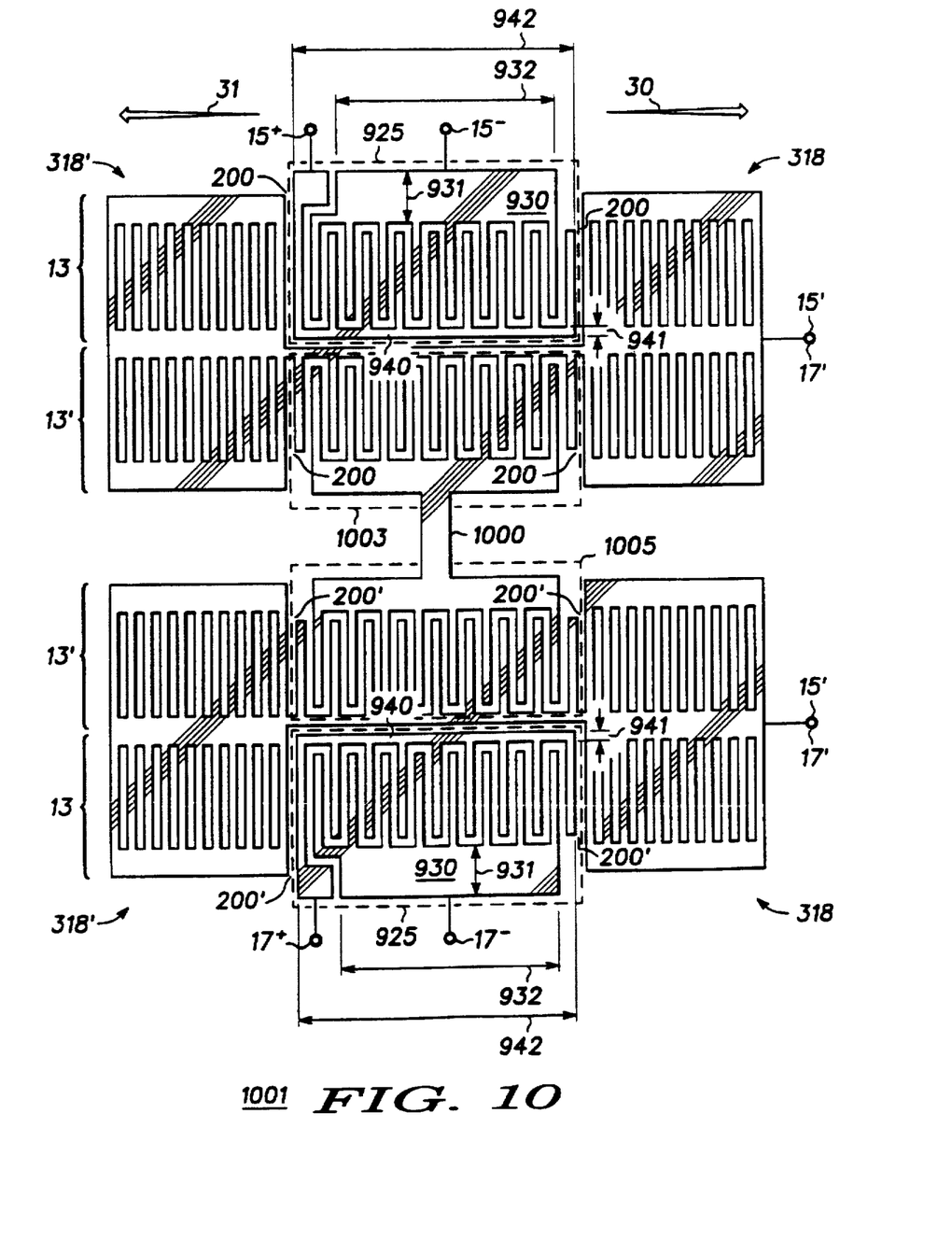
FIG. 10 illustrates a sixth embodiment of the present invention applied to a four-pole transversely-coupled filter is formed having a single coupling track between the resonator pairs.

FIG. 10 illustrates a sixth embodiment (similar to filter 701, FIG. 7) according to the present invention applied to four-pole transversely-coupled filter 1001. Filter 1001 includes single electrical coupling track 1000 between transducers 1003, 1005 disposed in second and third tracks 13'. It will be appreciated that ground interconnections 15', 17' between second and third tracks 13' are also required for proper operation of filter 1001. A salient feature of transducers 925 of filter 1001 is that first bus bar 940 has first long dimension 942 and first short dimension 941, with the latter preferably having a dimension of less than an acoustic wavelength, while second bus bar 930, disposed parallel to first long dimension 942, has second long dimension 932 and second short dimension 931, with second short dimension 931 exceeding an acoustic wavelength. Again, applicants have discovered improvements in insertion loss for this design. In one design, first short dimension 941 was chosen to be 0.207 wavelength wide and separated from neighboring structures by gaps of 0.162 wavelength. This filter provided an insertion loss of about six dB at a frequency of 400 MHz, without a tuning inductor, and provided an insertion loss of 4–5 dB with an inductor.

It is often useful to make gaps 200, 200' of different sizes because these gaps dictate placement of spurious out-of-band responses in frequency. By making gaps 200 of a first size (e.g., one-half of a wavelength measured along direction 30 or 31) and gaps 200' of a different size (e.g., six-tenths of a wavelength measured along direction 30 or 31), the filters of FIGS. 2, 4, 7, 8 and 10 may be made to have the spurious response from one two-pole group coincident in frequency with nulls from the other two-pole group, improving the overall out-of-band rejection of the composite filter. SAW filters such as those illustrated in FIGS. 1–10 may be constructed on suitably prepared substrates such as quartz ($SiO_2$), lithium niobate ($LiNbO_3$), lithium tantalate ($LiTaO_3$) and lithium tetraborate ($Li_2B_4O_7$).

Synopsis

A series of transversely coupled resonator filters were fabricated and tested using designs illustrated in FIGS. 5–10. Tests were made with and without shunt inductors between the two two-pole sections. The results are summarized in Table I below.

Comparison of the data of Table I shows that a single two-pole filter section provides modest insertion loss and moderately poor out-of-band rejection. Including a shunt inductor in the four-pole designs improves insertion loss by one to about two and a half dB, with mixed results on out-of-band rejection. The 10* optimized design used a transducer having a slightly greater center frequency than the grating frequency to compensate for passband distortions arising from electromechanical loading effects. This design provides an attractive combination of insertion loss, passband bandwidth, out-of-band rejection and spurious signal response.

TABLE I

| Experimental results for transversely coupled resonator filters. | | | | |
|---|---|---|---|---|
| Type (FIG.) | IL (dB) | BW (%) | Spur (dB) | Rej. (dB) |
| 3 | 1.6 | 0.096 | 10 | 23 |
| 4 | 5.0 | 0.06 | 38 | 44 |
| 4 | 3.8 | 0.09 | 34 | 44 |
| 7 | 8.3 | 0.08 | 31 | 55 |
| 7 | 5.1 | 0.09 | 11 | 40 |
| 8 | 7.9 | 0.08 | 32 | 50 |
| 8 | 5.4 | 0.07 | 8 | 35 |
| 10 | 9.0 | 0.09 | 30 | 54 |
| 10 | 6.4 | 0.07 | 28 | 58 |
| 10* | 6.1 | 0.07 | 34 | 55 |

TABLE I-continued

| Experimental results for transversely coupled resonator filters. | | | | |
|---|---|---|---|---|
| Type (FIG.) | IL (dB) | BW (%) | Spur (dB) | Rej. (dB) |
| 10* | 5.1 | 0.10 | 30 | 42 |

Type refers to FIG. No. illustrating the filter type, with the top set of data for each type corresponding to no shunt inductor and the bottom set of data for each filter type including a shunt inductor (asterisk indicates optimized design);
IL = insertion loss;
BW = bandwidth, 1.5 dB for two pole designs (e.g., 3) and 3 dB for four-pole designs (e.g., 4 and higher);
Spur = spurious signal level;
Rej. = out of band rejection.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. An acoustic wave device comprising:
   a substrate capable of supporting acoustic wave propagation; and
   a first transducer disposed on said substrate, said first transducer comprising:
      a first group of electrodes having a first periodicity disposed on said substrate and coupled to a first bus bar which is coupled to a first electrical connection, said first group of electrodes having a breadth perpendicular to a direction of acoustic wave propagation; and
      a second group of electrodes having said first periodicity disposed on said substrate and coupled to a common electrical interconnection, said second group of electrodes having a breadth perpendicular to the direction of acoustic wave propagation and are interleaved with said first group of electrodes; and
   a second transducer disposed on said substrate, said second transducer transversely acoustically coupled to said first transducer, said second transducer comprising:
      a third group of electrodes having a second periodicity disposed on said substrate and coupled to a second bus bar which is coupled to a second electrical connection, said third group of electrodes having a breadth perpendicular to the direction of acoustic wave propagation and having an offset from said first group of electrodes in a direction perpendicular to the direction of acoustic wave propagation; and
      a fourth group of electrodes having said second periodicity disposed on said substrate and coupled to a third bus bar which is coupled to a third electrical connection, said fourth group of electrodes having a breadth perpendicular to the direction of acoustic wave propagation and are interleaved with said third group of electrodes, said second and third electrical connections being electrically balanced and electrically isolated from the other electrical connections.

2. The acoustic wave device of claim 1, further comprising:
   a first set of reflectors disposed adjacent to both ends of said first group of electrodes and acoustically coupled therewith in an in-line configuration in the direction of acoustic wave propagation and separated from said first group of electrodes by gaps of a first width, said first set of reflectors having electrodes of a third periodicity; and a second set of reflectors disposed adjacent to both ends of said third group of electrodes and acoustically coupled therewith in an in-line configuration in the direction of acoustic wave propagation and separated from said third group of electrodes by a gap of a second width, said second set of reflectors have electrodes of a fourth periodicity, said first and second sets of reflectors being commonly connected to the common electrical interconnection.

3. The acoustic wave device of claim 2, wherein said second bus bar has a dimension perpendicular to the direction of acoustic wave propagation of about one micrometer, said second bus bar being separated from the common electrical interconnection by no more than one micrometer.

4. The acoustic wave device of claim 2, wherein said periodicities of said acoustic wave device includes at least one of the group of: said first and third periodicities being unequal, and said second and fourth periodicities being unequal.

5. The acoustic wave device of claim 2, wherein said gaps of first and second widths are unequal.

6. The acoustic wave device of claim 5, wherein said gap of first width is about one-half wavelength and said gap of second width is slightly greater than one-half wavelength.

7. The acoustic wave device of claim 2, wherein the breadths of the first, second, third and fourth groups of electrodes range from four to thirteen acoustic wavelengths.

8. The acoustic wave device of claim 7, wherein the breadths of the first, second, third and fourth groups of electrodes range from seven to ten acoustic wavelengths.

9. Two of the acoustic wave devices of claim 2, further comprising an electrical coupling track connecting the first electrical connections of each acoustic wave device, the associated second and third electrical connections of each acoustic wave device providing an electrically balanced differential input and an electrically balanced differential output, respectively.

10. An acoustic wave device comprising:

a substrate capable of supporting acoustic wave propagation; and a first transducer disposed on said substrate, said first transducer including in combination:

a first set of interleaved comb electrodes having a first periodicity, said first set of comb electrodes having a first electrical connection via a first bus bar and a common electrical interconnection; and a first set of reflectors disposed adjacent to both ends of said first set of electrodes and acoustically coupled therewith in an in-line configuration and separated from said first set of electrodes by gaps of a first width, said first set of reflectors having electrodes of a third periodicity, and a second transducer disposed on said substrate, said second transducer transversely acoustically coupled to said first transducer, said second transducer comprising:

a second set of interleaved comb electrodes having a second periodicity, said second set of comb electrodes having a second electrical connection via a second bus bar and a third electrical connection via a third bus bar, the second bus bar being proximate to the common interconnection, the second and third electrical connections being electrically balanced and electrically isolated from the other electrical connections; and a second set of reflectors disposed adjacent to both ends of said second set of electrodes and acoustically coupled therewith in an in-line configuration and separated from said second set of electrodes by gaps of a second width, said second set of reflectors having electrodes of a fourth periodicity;

said first and second sets of reflectors being commonly connected to the common electrical interconnection, said first periodicity being slightly less than said third periodicity, said second periodicity being slightly less than said fourth periodicity, said first widths being about one-half wavelength and said second widths being slightly greater than one-half wavelength.

11. The acoustic wave device of claim 10, wherein said second bus bar has a dimension perpendicular to a direction of acoustic wave propagation of about 0.2 wavelength, said second bus bar being separated from the common electrical interconnection by less than 0.2 wavelength.

12. Two of the acoustic wave devices of claim 10, further comprising an electrical coupling track connecting the first electrical connections of each acoustic wave device, the associated second and third electrical connections of each acoustic wave device providing an electrically balanced differential input and an electrically balanced differential output, respectively.

* * * * *

UNITED STATES PATENT AND TRADEMARK OFFICE
CERTIFICATE OF CORRECTION

PATENT NO.    : 5,793,266
DATED         : August 11, 1998
INVENTOR(S)   : Park et al.

It is certified that error appears in the above-identified patent and that said Letters Patent is hereby corrected as shown below:

Column 2,
Line 13, "at lease one" should read -- at least one --.

Column 3,
Line 56, "complimentary" should read -- complementary --.

Column 4,
Line 44, "will generator a pulse" should read -- will generate a pulse --.

Column 5,
Line 66, "principals" should read -- principles --.

Column 6,
Line 2, "principals" should read -- principles --.
Line 50, "complimentary" should read -- complementary --.

Column 8,
Line 14, "complimentary" should read -- complementary --.

Signed and Sealed this

Thirtieth Day of July, 2002

Attest:

JAMES E. ROGAN
Attesting Officer   Director of the United States Patent and Trademark Office